United States Patent [19]

Leuthold et al.

[11] Patent Number: 4,829,268

[45] Date of Patent: May 9, 1989

[54] LOOP FILTER FOR FREQUENCY MULTIPLYING PHASE LOCKED LOOP

[75] Inventors: Oskar N. Leuthold, Newport Beach; Steven G. Check, Costa Mesa, both of Calif.

[73] Assignee: Hughes Aircraft Company, Los Angeles, Calif.

[21] Appl. No.: 192,977

[22] Filed: May 12, 1988

[51] Int. Cl.⁴ .............................................. H03L 7/00
[52] U.S. Cl. ..................................... 331/17; 307/520; 328/167
[58] Field of Search ........................... 331/1 A, 17, 25; 307/520, 521; 328/167

[56] References Cited

U.S. PATENT DOCUMENTS 4,649,353 3/1987 Sonnenberg ...................... 331/17 X

OTHER PUBLICATIONS

Turner, Phase Locked Loop Phase Adjustment, IBM Technical Disclosure Bulletin, vol. 15, No. 7 Dec. 1972, pp. 2080-2081.
"The RCA COS/MOS Phase-Locked Loop, A Versatile Building Block for Micro-Power Digital and Analog Applications," Morgan, RCA Solid State '74 Databook Series pp. 360-367, RCA Corporation, 1973.
"A Single-Chip Code with Switched-Capacitor Filters," Iwata et al., IEEE Journal of Solid State Physics, vol. SC-16, No. 4, pp. 315-321, Aug. 1981.

Primary Examiner—Eugene R. LaRoche
Assistant Examiner—Robert J. Pascal
Attorney, Agent, or Firm—Terje Gudmestad; Kenneth W. Float; A. W. Karambelas

[57] ABSTRACT

A loop filter for a phase locked loop system having a voltage controlled oscillator (VCO), a divide-by-N circuit responsive to the output of the VCO, and an edge sensitive phase/frequency comparator responsive to the output of the divide-by-N circuit and a reference timing signal for providing a first control signal when the output of the divide-by-N circuit lags the reference timing signal or a second control signal when the output of the divide-by-N circuit leads the reference signal. The loop filter specifically includes first and second capacitors serially coupled between an output node and a ground reference node, wherein the second capacitor is connected to the ground reference node and the output node provides a control voltage to the VCO. A first current source is controllably connected by a first switch to the output node in response to the first control signal, whereby the first current source charges the first and second serially coupled capacitors. A second current source is controllably connected by a second switch to the output node in response to the second control signal, whereby the second current source discharges the first and second serially coupled capacitors. A third switch is coupled across the terminals of the second capacitor for controllably shorting the second capacitor.

5 Claims, 2 Drawing Sheets

4,829,268

LOOP FILTER FOR FREQUENCY MULTIPLYING PHASE LOCKED LOOP

BACKGROUND OF THE INVENTION

The disclosed invention generally relates to phase locked loop circuits, and is more particularly directed to a loop filter for phase lock loop circuits which provides for reduced perturbations on the phase locked loop circuit output when output frequency correction takes place.

Phase lock loop (PLL) circuits are closed loop circuits which are utilized in signal processing and digital systems to provide timing signals having predetermined frequencies. In a given PLL circuit, the frequency of the output signal is derived from a reference signal having a reference frequency, which may be provided by an appropriate crystal oscillator circuit, for example.

A PLL circuit generally includes a voltage controlled oscillator (VCO), a divide-by-N circuit, a frequency/phase comparator, and a loop filter. The VCO is controlled by the voltage output of the loop filter, which in turn is controlled by the frequency/phase comparator. The VCO provides the output of the PLL circuit which has a frequency that is N times the frequency of a reference signal. The output of the VCO is also provided to the divide-by-N circuit, which provides an output that is coupled to the phase/frequency comparator along with the reference signal.

Examples of phase-locked loop circuits are shown in "The RCA COS/MOS Phase-Locked Loop, A Versatile Building Block for Micro-Power Digital and Analog Applications," Morgan, RCA Solid State '74 Databook Series, pp. 360-367, RCA Corporation, 1973.

In operation, the output frequency is determined by the control voltage provided by the loop filter, and correction is achieved by changing such control voltage. An important consideration with respect to a loop filter is the nature in which the control voltage is changed, particularly in the presence of phase jitter. In phase locked loop systems, as in circuits generally, there is noise, and such noise randomly causes slight phase jitter in the two signals applied to the phase/frequency comparator. The phase jitter will be detected in the phase/frequency comparator, and the output will include the effects of such phase jitter, causing changes in the output control voltage provided by the loop filter to the VCO. With known loop filter designs, the change in control voltage includes large abrupt voltage changes, which causes large frequency variations in the frequency of the PLL output signal provided by the VCO. Depending upon the application, the amount of variation in frequency could be intolerable.

An example of a known loop filter circuit is disclosed in "A Single-Chip Code with Switched-Capacitor Filters," Iwata et al, IEEE Journal of Solid-State Physics, Vol. SC-16, No. 4, pp. 315-321, August 1981.

SUMMARY OF THE INVENTION

It would therefore be an advantage to provide a loop filter for phase locked loop circuits which provides smoother changes in the control voltage provided to the voltage controlled oscillator, which results in reduced frequency variations in the output of the voltage controlled oscillator, and which can be implemented in integrated circuit form.

The foregoing and other advantages and features are provided by the invention in a phase locked loop filter which includes first and second serially coupled capacitors for providing a control voltage to a voltage controlled oscillator (VCO). The capacitors are selectively charged or discharged depending on whether the output frequency of the VCO is less than or greater than a selected frequency. The second capacitor is discharged after a predetermined time interval after the capacitors have been charged or discharged.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION

Figure 1:
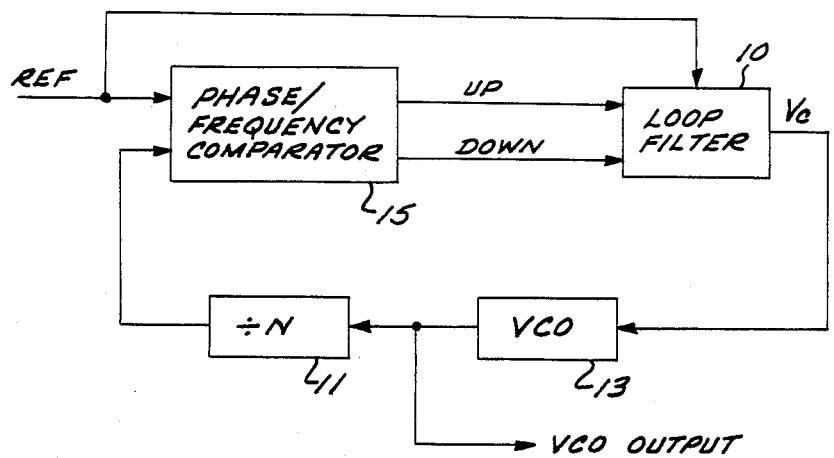
FIG. 1 is a block diagram illustrating the use of the disclosed loop filter.

In the following detailed description and in the several figures of the drawing, like elements are identified with like reference numerals.

For purposes of this discussion, and for ease of reference, digital logic signals are discussed in terms of LOW and HIGH levels, where the HIGH level generally identifies the active state. However, it should be readily understood that active low logic can also be utilized, the disclosed embodiment being exemplary only.

Referring now to FIG. 1, shown therein is a general block diagram of a phase-locked loop system in which the loop filter of the invention can be utilized. The phase-locked loop system includes a divide-by-N circuit 11 which is responsive to the output of a voltage controlled oscillator (VCO) 13. The output of the divide-by-N circuit 11, which is a signal having a frequency that is 1/N times the the frequency of the output signal provided by the VCO 13, is coupled to an edge sensitive frequency/phase comparator 15, which is also responsive to a reference timing signal REF. The frequency/phase comparator 15 provides UP and DOWN control signals to a loop filter 10, which generates a control voltage $V_c$ that is controlled by the UP and DOWN control signals, as well as the reference timing signal REF. Examples of edge sensitive phase/frequency comparators are shown in the previously identified article by Morgan in the RCA Solid State '74 Databook Series.

The output of the VCO 13 is the output of the phase-locked loop system and is intended to have a frequency of N times the frequency of the reference timing signal REF. By way of example, the reference timing signal REF can be provided by a crystal oscillator circuit.

Figure 2:
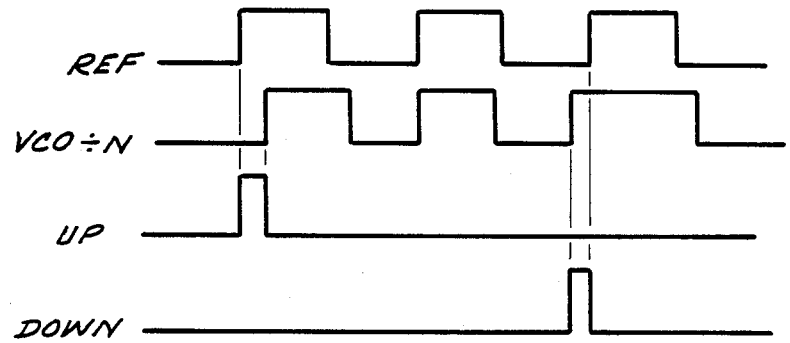
FIG. 2 illustrates waveforms helpful in understanding an edge sensitive phase/frequency comparator as used in the phase-locked loop of FIG. 1

Referring now to FIG. 2, shown therein are waveforms illustrating the operation of the edge sensitive phase/frequency comparator 15. For example, when the output of the divide-by-N circuit 11 lags the reference timing signal, indicating that the frequency of the output of the VCO 13 is low, the UP signal is HIGH during the lag interval. In response to the UP control signal being HIGH, the loop filter 10 increases the control voltage provided to the VCO.

When the output of the divide-by-N circuit 11 leads the reference timing signal REF, indicating that the frequency of the VCO output is high, the DOWN signal is HIGH during the lead interval. In response to the DOWN control signal being HIGH, the loop filter 10 decreases the control voltage provided to the VCO 13.

Figure 3:
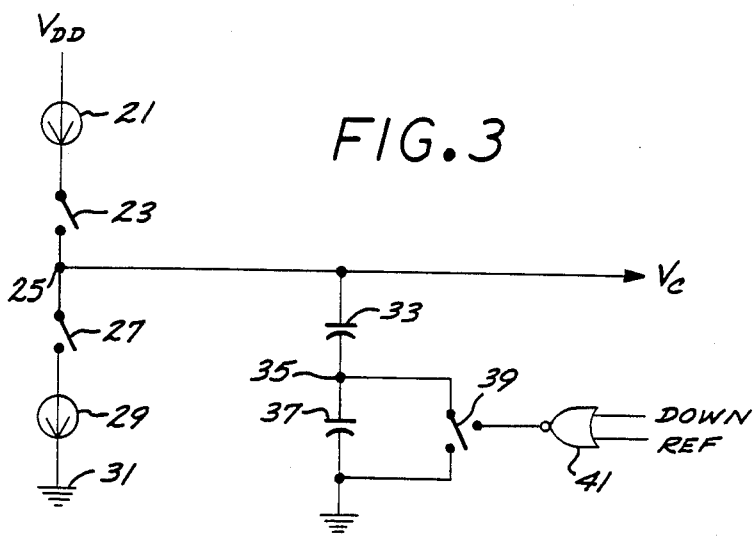
FIG. 3 is a schematic diagram of a loop filter circuit in accordance with the present invention.

Referring now to FIG. 3, shown therein is a phase locked loop filter 10 which provides for smooth changes to the control voltage provided to the VCO 13. The loop filter 10 includes a first current source 21 and a first switch 23 serially connected between a voltage source $V_{dd}$ and a node 25. A second switch 27 and a second current source 29 are serially coupled between the node 25 and a common reference voltage 31, which can be ground. By way of example, the first and second current sources 21, 29 provide substantially the same current level.

The first and second switches 23, 27 are respectively controlled by UP and DOWN signals provided by the frequency/phase comparator 15. Specifically, the first current source 21 is connected to the node 25 only when the UP signal is HIGH, while the second current source 29 is connected to the node 25 only when the DOWN signal is HIGH. Since the frequency/phase comparator 15 is edge sensitive, the UP control signal and the DOWN control signal cannot be HIGH at the same time, although they can both be LOW at the same time.

The loop filter 10 further includes a capacitor 33 connected between the node 25 and a node 35, and a capacitor 37 coupled between the node 35 and the common reference voltage 31. By way of example, the capacitors 33, 37 are of equal value.

A switch 39 is connected in between the node 35 and the common reference voltage 31 in parallel with the capacitor 37. The switch 39 is controlled by the output of a two-input NOR gate 41, and is closed pursuant to a HIGH output from the NOR gate 41. The inputs to the NOR gate 41 are the reference timing signal REF and the DOWN control signal. The NOR gate 41 provides a HIGH output only when both the reference timing signal REF and the DOWN control reference signal are LOW. Otherwise, the output of the NOR gate is LOW.

Figure 4:
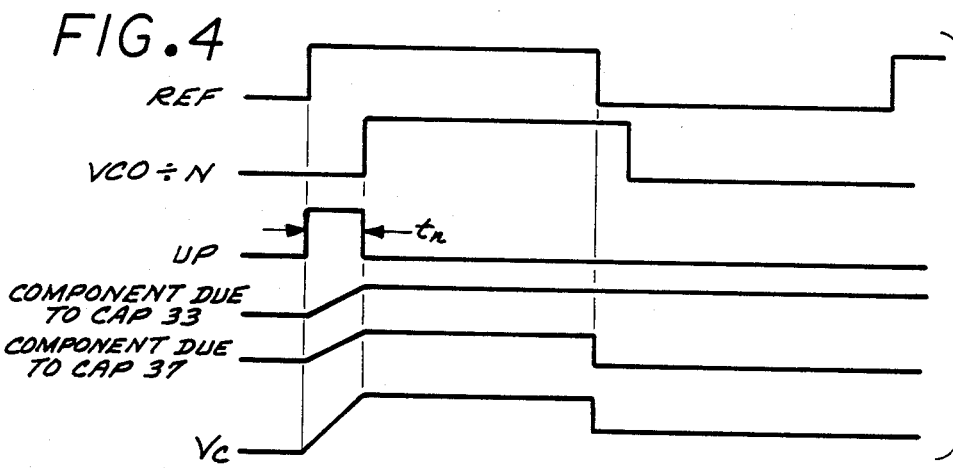
FIG. 4 illustrates the output control voltage provided by the loop filter of FIG. 3 when such output control voltage is increased.
Figure 5:
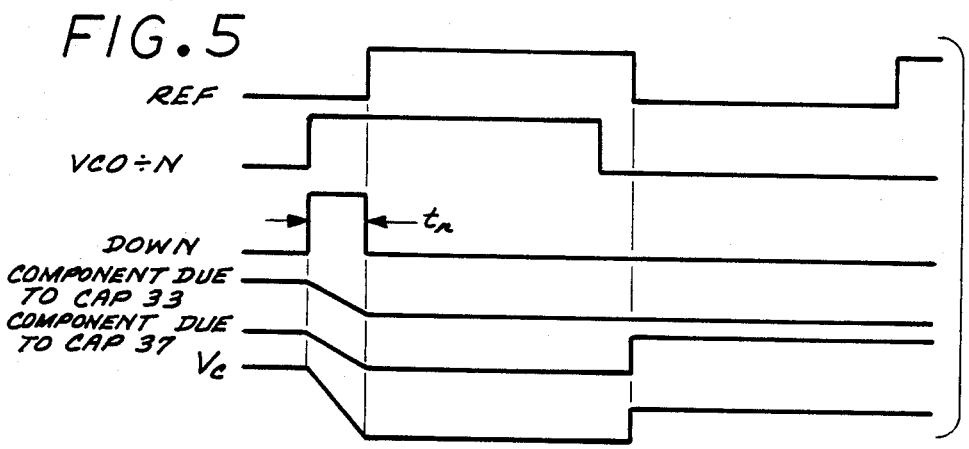
FIG. 5 illustrates the output control voltage provided by the loop filter of FIG. 3 when such output control voltage is decreased.

The control voltage output $V_c$ of the loop filter 10, which is provided to the VCO 13, and the control of that voltage in conjunction with the operation of the loop filter 10 can be best understood with reference to FIGS. 2, 4 and 5. It should be readily appreciated that the foregoing loop filter is preferably utilized with a VCO 13 having a very high input impedance, so that the output control voltage $V_c$ is not substantially changed by the VCO.

FIG. 4 illustrates the condition where the UP control signal goes HIGH in response to the lag of the output of the divide-by-N circuit 11 relative to the reference timing signal REF. When the reference timing signal REF transitions HIGH, the switch 39 opens and remains open until both the reference timing signal REF and the DOWN control signal are both LOW.

While the UP control signal is HIGH, the capacitors 33, 37 charge in response to the current source 21, and the control voltage $V_c$ increases substantially linearly.

After the UP control signal transitions to LOW, and while the reference timing signal REF is HIGH, the switch 39 remains open and the charge on the capacitors 33, 37 remains constant, as does the control voltage $V_c$. When the reference timing signal REF transitions to LOW, the DOWN control signal will still be LOW, and therefore the output of the NOR gate 41 transitions to HIGH, which causes the switch 39 to close. When the switch 39 closes, the control voltage $V_c$ at the node 23 drops by the amount of voltage across the capacitor 37, and the capacitor 37 is shorted. The output control voltage $V_c$ after the drop is greater than what it was prior to the occurrence of the HIGH UP control signal. Pursuant to the control of the NOR gate 41, the switch 39 will subsequently open when reference timing signal REF transitions to HIGH or when the DOWN control signal transitions to HIGH.

Referring now to FIG. 5, illustrated therein is the condition where the DOWN control signal goes HIGH in response to the lead of the output of the divide-by-N circuit 11 relative to the reference timing signal REF. In response to the DOWN control signal transitioning to HIGH, the switch 39 opens and remains open until both the reference timing signal REF and the DOWN control signal are LOW.

While the DOWN control signal is HIGH, the switch 27 is closed, the switch 39 is open, and the capacitors 33, 37 discharge, whereby the output control voltage $V_c$ decreases substantially linearly. As a result of the discharge, the voltage on the node 35 goes below the level of the common reference voltage 31. After the DOWN control signal transitions to LOW, the output voltage $V_c$ remains substantially constant until the switch 39 closes when the reference timing signal REF goes LOW while the DOWN control signal is LOW. The closing of the switch 39 causes the output voltage $V_c$ to increase abruptly by an amount equal to the voltage across the capacitor 37. The output control voltage $V_c$ after the switch 39 closes is less than what it was immediately prior to the occurrence of the HIGH DOWN control signal.

The frequency variation provided by the loop filter 10 can be appreciated by considering the following. By way of specific example, each of the capacitors 33, 37 is 6 picofarads, each of the current sources 21, 29 provides 30 nanoamps, and the desired VCO output frequency is 1 MHz. Assuming a 1.6% phase jitter, the UP or DOWN control signals would be HIGH for 488 nanoseconds. The abrupt change in the output control voltage is determined by the change in the voltage of the capacitor 37, which is determined by the product of (a) the time period during which the UP or DOWN control signal is HIGH and (b) the quotient of the current divided by capacitance. In this particular example, that would be $(488 \times 10^{-9}) \times (30 \times 10^{-9}/10 \times 10^{-12})$, or 0.00146 volts. For a VCO having a characteristic of 6 MHz per volt, the VCO output frequency deviation is 0.8 percent.

Assuming a 5% phase jitter, which is quite high, with the foregoing circuit parameters, the VCO output frequency deviation is 2.5 percent.

The foregoing loop filter may be advantageously implemented in integrated circuit form wherein the current sources and the switches can comprise FET's, and the capacitors can comprise MOS capacitors.

The foregoing has been a disclosure of a loop filter circuit for a phase locked loop system which provides for less abrupt voltage changes in the voltage provided to the VCO, which results in smaller frequency variation in the output of the VCO. Such smaller frequency variation allows for the use of the loop filter in phase locked loop applications which have stringent frequency requirements.

Although the foregoing has been a description and illustration of specific embodiments of the invention, various modifications and changes thereto can be made by persons skilled in the art without departing from the scope and spirit of the invention as defined by the following claims.

What is claimed is:

1. A loop filter for a phase locked loop system having a voltage controlled oscillator (VCO), a divide by N circuit responsive to the output of the VCO, and an edge sensitive phase/frequency comparator responsive to the output of the divide-by-N circuit and a reference timing signal having a reference frequency for providing a first control signal when the output of the divide-by-N circuit lags the reference signal or a second control signal when the output of the divide-by-N circuit leads the reference signal, the loop filter providing a control voltage for the VCO and comprising:

first and second serially coupled capacitors for providing the output control voltage for the VCO of the phase locked loop system;
   charging means responsive to the first control signal for charging said first and second capacitors during the presence of the first control signal to increase said output control voltage;
   discharging means responsive to the second control signal for discharging said first and second capacitors during the presence of the second control signal to decrease said output control voltage; and
   means for selectively shorting said second capacitor after said first and second capacitors have been charged or discharged.

2. The loop filter circuit of claim 1 wherein said charging means comprises a current source and a switch responsive to said first control signal.

3. The loop filter circuit of claim 1 wherein said discharging means comprises a current source and a switch responsive to said second control signal.

4. The loop filter circuit of claim 1 wherein said means for shorting said second capacitor comprises a switch connected across the terminals of said second capacitor.

5. A loop filter for a phase locked loop system having a voltage controlled oscillator (VCO), a divide-by-N circuit responsive to the output of the VCO, and an edge sensitive phase/frequency comparator responsive to the output of the divide-by-N circuit and a reference timing signal having a reference frequency for providing a first control signal when the output of the divide-by-N circuit lags the reference signal or a second control signal when the output of the divide-by-N circuit leads the reference signal, the loop filter providing a control voltage for the VCO and comprising:

first and second capacitors serially coupled between an output node and a ground reference potential, wherein said second capacitor is coupled to said ground reference potential;
   a first current source;
   a first switch for controllably connecting said first current source to said output node in response to said first control signal, whereby said first current source charges said first and second serially coupled capacitors during the presence of said first control signal;
   a second current source;
   a second switch for controllably connecting said second current source to said output node in response to said second control signal, whereby said second current source discharges said first and second serially coupled capacitors during the presence of said second control signal; and
   a third switch coupled across the terminals of said second capacitor for controllably shorting said second capacitor after said first and second capacitors have been charged or discharged.

* * * * *